(12) United States Patent
Gamble

(10) Patent No.: US 11,368,043 B1
(45) Date of Patent: Jun. 21, 2022

(54) SYSTEM FOR CHARGING ELECTRICAL DEVICES USING A SOLAR CELL BAND

(71) Applicant: Rondell Gamble, Santa Ana, CA (US)

(72) Inventor: Rondell Gamble, Santa Ana, CA (US)

(*) Notice: Subject to any disclaimer, the term of this patent is extended or adjusted under 35 U.S.C. 154(b) by 289 days.

(21) Appl. No.: 16/601,199

(22) Filed: Oct. 14, 2019

(51) Int. Cl.
| | |
|---|---|
| *H02J 7/35* | (2006.01) |
| *H02S 10/40* | (2014.01) |
| *H02S 40/38* | (2014.01) |
| *H02S 40/34* | (2014.01) |
| *H02J 7/00* | (2006.01) |

(52) U.S. Cl.
CPC .............. *H02J 7/35* (2013.01); *H02J 7/00* (2013.01); *H02S 10/40* (2014.12); *H02S 40/34* (2014.12); *H02S 40/38* (2014.12)

(58) Field of Classification Search
CPC .......... H02J 7/35; H02J 3/383; H02J 2300/24; H02S 10/40; H02S 40/00; H02S 40/34–38; H02S 30/00; H02S 30/10; H02S 30/20; Y02E 10/50; Y02E 10/52–56
See application file for complete search history.

(56) References Cited

U.S. PATENT DOCUMENTS

| | | | |
|---|---|---|---|
| 191,704 A | 6/1877 | Nagle | |
| 2020/0266655 A1* | 8/2020 | Thelusma | .............. G04C 10/02 |

FOREIGN PATENT DOCUMENTS

| | | | |
|---|---|---|---|
| CN | 201113841 Y | * | 9/2008 |
| CN | 207021758 U | * | 2/2018 |

OTHER PUBLICATIONS

Machine translation of CN-207021758-U (Year: 2021).*
Machine translation of CN-201113841-Y (Year: 2021).*

* cited by examiner

*Primary Examiner* — David V Henze-Gongola
(74) *Attorney, Agent, or Firm* — Sanchelima & Associates, P.A.; Christian Sanchelima; Jesus Sanchelima

(57) ABSTRACT

A system for charging electrical devices using a solar cell band comprising a band assembly and a solar pad assembly. The band assembly comprises of a band having a charging port and wires therein. The charging port allows a user to charge an electronic device such as a smartwatch, phone, and the like. Additionally, the wires create a connection with the charging port and the solar pad assembly. The solar pad assembly includes a solar pad and solar cells. The solar pad and the solar cells are located on the band and is configured to gather solar energy and convert it to electrical energy. The electrical energy is then stored in a battery located on the band.

1 Claim, 2 Drawing Sheets

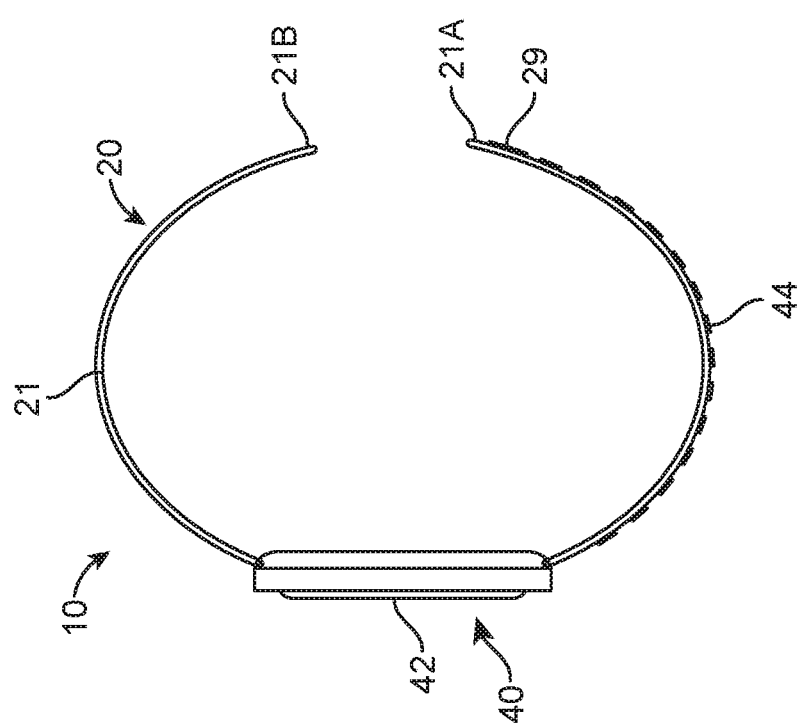

SYSTEM FOR CHARGING ELECTRICAL DEVICES USING A SOLAR CELL BAND

BACKGROUND OF THE INVENTION

1. Field of the Invention

The present invention relates to a solar cell band and, more particularly, to a system for charging electrical devices using a solar cell band that is configured to aid a user in charging an electrical device using natural solar energy.

2. Description of the Related Art

Several designs for a system for charging electrical devices using a solar cell band have been designed in the past. None of them, however, include a watch band having integral solar cells or a heat to electricity conversion system which can be used to recharge a battery powered watch or fitness band. It is known that individuals often carry around electronic devices such as cell phones, smart watches, and the like in their everyday life. It is also known that these electronic devices often run out of battery after continuous use. In order for a user to recharge their device it requires them to carry around bulky charges configured to be attached to a wall outlet. This means of recharging an electronic device is cumbersome and does not use natural energy. Therefore, there is a need for a portable device that allows a user to easily charge electronic devices using natural energy such as solar energy.

Applicant believes that a related reference corresponds to U.S. patent (published application) No. 2014/0191704 for a portable solar cell device for use in attaching to and charging devices such as phones and wristwatches. However, it differs from the present invention because the 2014/0191704 reference fails to provide an easy to use device in the form of a wristband to allow a user to charge an electronic device. The reference additionally discloses a device that is cumbersome to carry around. The present invention addresses these issues by providing a portable charging device in the form of a wristband that allows a user to charge an electronic device. The present invention additionally utilizes solar energy to be converted to electrical energy for a user to use in order to charge and electronic device.

Other documents describing the closest subject matter provide for a number of more or less complicated features that fail to solve the problem in an efficient and economical way. None of these patents suggest the novel features of the present invention.

SUMMARY OF THE INVENTION

It is one of the objects of the present invention to provide a system for charging electrical devices using a solar cell band that allows a user to convert solar energy to electrical energy to be stored on a wristband.

It is another object of this invention to provide a system for charging electrical devices using a solar cell band that allows a user to utilize the electrical energy stored within the wristband to charge an electrical device.

It is still another object of the present invention to provide a system for charging electrical devices using a solar cell band that is effortless to use and easily portable by a user.

It is yet another object of this invention to provide such a device that is inexpensive to implement and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which:

FIG. 2 shows a side view of a system for charging electrical devices 10 in accordance with an embodiment of the present invention.

DETAILED DESCRIPTION OF THE EMBODIMENTS OF THE INVENTION

Figure 1:
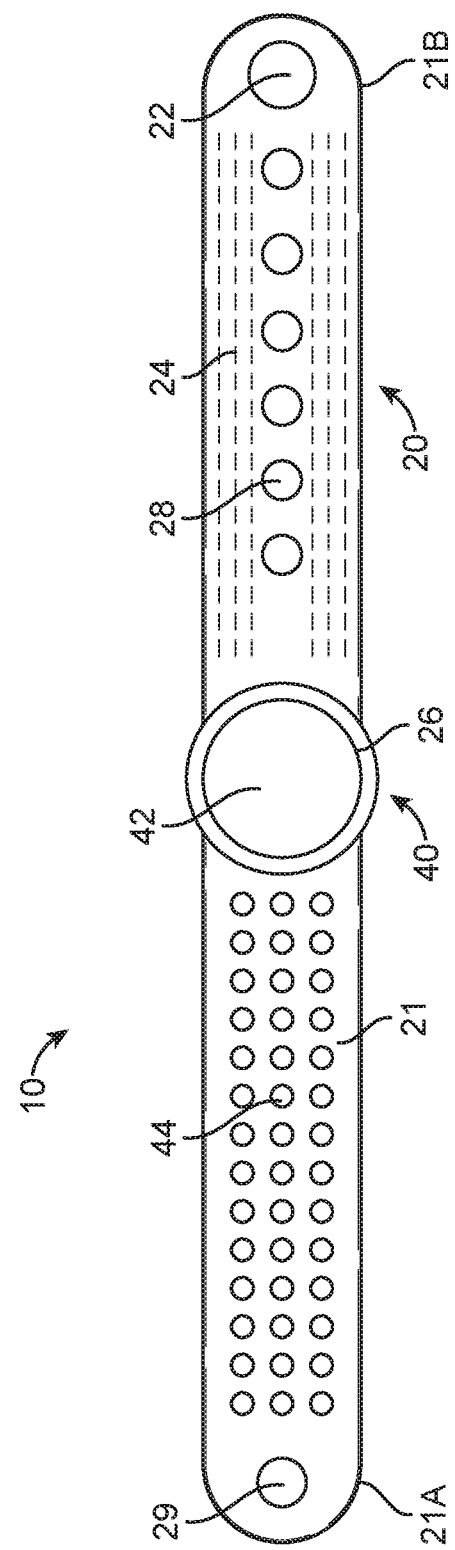
FIG. 1 represents a front view of a system for charging electronic devices using a solar cells band 10 wherein band assembly 20 and solar pad assembly 40 may be observed in accordance with an embodiment of the present invention.

Referring now to the drawings, where the present invention is generally referred to with numeral 10, it can be observed a system for charging electrical devices using a solar cell band 10 that basically includes a band assembly 20 and a solar bad assembly 40.

Band assembly 20 includes a band 21 having a first end 21A and a second end 21B. Band 21 may be made of any suitable material such as rubber, leather, and the like. Additionally, first end 21A and second end 21B may be circular in shape. However, It should be understood that additional embodiments of the present invention may include bands made of other suitable materials for wrists and other designs for first end 21A and second end 21B. Band 21 further includes a charging port 22 and wires 24. Charging port 22 is located on second end 21B of band 21. Charging port 22 may be of any suitable port hardware for charging an electronic device such as a USB port, micro USB port, and the like. Charging port 22 is adapted to receive a charging cable such as a USB cable, micro USB cable and the like. The cable is then plugged into an electronic device to be charged by system for charging electronic devices using a solar cell band 10. Additionally, solar cell band 10 may send and receive data through the USB port. Wires 24 communicably connect charging port 22 to a battery 26 located on band 24. In one embodiment of the present invention, wires 24 are made of a copper or gold material. However, it should be understood that wires 24 may be made of any suitable material for the transfer of electrical energy. In another embodiment of the present invention, battery 26 is circular in shape. However, battery 26 may be of any suitable shape to being attached to band 21. Band 21 further includes holes 28 for receiving a protrusion 29 for securely mounting band 21 to a user's wrist, arm or leg. Protrusion 29 may be located on first end 21A of band 21. Although the present embodiment depicts holes 28 and protrusion 29 as a method for securely mounting band 21 to a user's wrist, arm, or leg any suitable mounting mechanism may be used to attach band 21 to a user's wrist, arm or leg. In another embodiment of the present invention, system for charging electronic devices using a solar cell band 10 may be configured to transform heat energy from a user's movement into additional electrical energy to be stored in battery 26.

Solar pad assembly 40 includes a solar pad 42 and solar cells 44. Solar pad 42 may be located on the center of band 21 and may be circular in shape. Solar pad 42 is a hardware component mounted onto band assembly 20 configured to transform solar energy gathered from a light source, to electrical energy. The electrical energy converted from solar pad 22 is stored in battery 26. It should be understood that solar pad 42 may be of any suitable shape and location to be mounted on band 21. The present embodiment depicts solar pad 42 being circular in shape and mounted on top of battery 26. Solar cells 44 are located on the outer surface band 21. The present embodiment depicts solar cells 44 being on one side of band 21. However, it should be understood that other embodiments include solar cells 44 located on other suitable areas of band 21. Solar cells 44 are hardware components mounted onto band 20 assembly 20 and configured to transform solar energy gathered from a light source to electrical energy. In one embodiment of the present invention solar cells 44 may be perovskite solar cells. However, it should be understood that any form of solar cells may be used for solar cells 44. The electrical energy converted from solar cells 44 is then stored in battery 26. A user may then utilize electrical energy stored in battery 26 to charge an electrical device using charging port 22.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A device for charging electronic devices using a solar cell band, consisting of:
   a. a band assembly, including a band, said band having a first end and a second end, wherein said band includes a charging port located at said second end, said band assembly further includes wires communicably mounted to a battery located on said band, said first end and said second end is circular in shape, said charging port is a USB charging port, said battery is circular in shape, said band includes holes configured to receive a protrusion for securely mounting said band to a user's wrist; and
   b. a solar pad assembly, said solar pad assembly includes a solar pad and solar cells located on said band, said solar pad and said solar cells convert sunlight energy to electrical energy, said solar cells are directly mounted onto the band, said solar cells are placed longitudinally with respect to said band between said first end and said solar pad, said solar pad is circular shape and mounted on top of said battery, said battery stores electrical energy provided by said solar pad and said solar cells, the battery is connected to said charging port by wires.

* * * * *